(12) United States Patent
Huang et al.

(10) Patent No.: US 11,588,588 B2
(45) Date of Patent: Feb. 21, 2023

(54) ADDITIONAL BIT FREEZING FOR POLAR CODING

(71) Applicant: MediaTek Inc., Hsinchu (TW)

(72) Inventors: Tun-Ping Huang, Hsinchu (TW); Wei-De Wu, Hsinchu (TW); Mao-Ching Chiu, Hsinchu (TW); Chia-Wei Tai, Hsinchu (TW); Tien-Yu Lin, Hsinchu (TW)

(73) Assignee: MediaTek Inc.

( * ) Notice: Subject to any disclaimer, the term of this patent is extended or adjusted under 35 U.S.C. 154(b) by 0 days.

(21) Appl. No.: 17/365,965

(22) Filed: Jul. 1, 2021

(65) Prior Publication Data
US 2022/0045784 A1    Feb. 10, 2022

Related U.S. Application Data

(60) Provisional application No. 63/072,980, filed on Sep. 1, 2020, provisional application No. 63/068,419, filed
(Continued)

(51) Int. Cl.
| | |
|---|---|
| *H04L 1/18* | (2006.01) |
| *H04L 1/00* | (2006.01) |
| *H03M 13/27* | (2006.01) |
| *H03M 13/13* | (2006.01) |
| *H03M 13/09* | (2006.01) |
| *H03M 13/00* | (2006.01) |

(Continued)

(52) U.S. Cl.
CPC .......... *H04L 1/1819* (2013.01); *H03M 13/09* (2013.01); *H03M 13/13* (2013.01); *H03M 13/27* (2013.01); *H03M 13/2906* (2013.01); *H03M 13/618* (2013.01); *H03M 13/6306* (2013.01); *H03M 13/6362* (2013.01); *H04L 1/0042* (2013.01); *H04L 1/0057* (2013.01); *H04L 1/0061* (2013.01); *H04L 1/0068* (2013.01); *H04L 1/0071* (2013.01); *H04L 1/08* (2013.01); *H04L 1/1893* (2013.01)

(58) Field of Classification Search
CPC ... H04L 1/0042; H04L 1/0057; H04L 1/0061; H04L 1/0068; H04L 1/0071; H04L 1/08; H04L 1/1893; H04L 1/1819; H03M 13/09; H03M 13/13; H03M 13/27; H03M 13/6306; H03M 13/6362; H03M 13/2906; H03M 13/618
See application file for complete search history.

(56) References Cited

U.S. PATENT DOCUMENTS

| | | | |
|---|---|---|---|
| 2019/0372591 A1* | 12/2019 | Chen | H04L 1/0052 |
| 2020/0099469 A1* | 3/2020 | Jiang | H04L 1/0041 |

(Continued)

*Primary Examiner* — Thien Nguyen
(74) *Attorney, Agent, or Firm* — Han IP PLLC; Andy M. Han

(57) ABSTRACT

Examples pertaining to additional bit freezing for polar coding are described. An apparatus performs polar coding to encode a plurality of input subblocks of information bits, frozen bits and optional cyclic redundancy check (CRC) bits to generate a plurality of subblocks of coded bits. The apparatus then transmits at least some of the subblocks of coded bits. In performing the polar coding, the apparatus additionally freezes one of the plurality of input subblocks corresponding to one of the interleaved plurality of sub-blocks of coded bits which decreases polarization gain due to puncturing.

12 Claims, 10 Drawing Sheets

Related U.S. Application Data on Aug. 21, 2020, provisional application No. 63/065,582, filed on Aug. 14, 2020, provisional application No. 63/063,567, filed on Aug. 10, 2020.

(51) Int. Cl.
| | | |
|---|---|---|
| *H04L 1/08* | (2006.01) | |
| *H03M 13/29* | (2006.01) | |
| *H04L 1/1812* | (2023.01) | |
| *H04L 1/1867* | (2023.01) | |

(56) References Cited

U.S. PATENT DOCUMENTS

2021/0013902 A1\* 1/2021 Jang ...................... H03M 13/09
2021/0143843 A1\* 5/2021 Nimbalker ............ H04L 1/0008

\* cited by examiner

900 

PERFORM, BY A PROCESSOR OF AN APPARATUS, POLAR CODING TO ENCODE A PLURALITY OF INPUT SUBBLOCKS OF INFORMATION BITS, FROZEN BITS AND OPTIONAL CYCLIC REDUNDANCY CHECK (CRC) BITS TO GENERATE A PLURALITY OF SUBBLOCKS OF CODED BITS BY:
- PERFORMING ENCODER INPUT BIT MAPPING AND FREEZING ON THE PLURALITY OF INPUT SUBBLOCKS;
- ADDITIONALLY FREEZING ONE OR MORE ENCODER INPUT BIT CHANNELS; AND
- RATE-MATCHING AND SUBBLOCK INTERLEAVING THE PLURALITY OF INPUT SUBBLOCKS TO RESULT IN ONE OR MORE PUNCTURED BITS THAT ARE PUNCTURED, ONE OR MORE SHORTENED BITS THAT ARE SHORTENED, AND ONE OR MORE OUTPUT BITS AS THE AT LEAST SOME OF THE SUBBLOCKS OF CODED BITS THAT ARE TRANSMITTED
910

TRANSMIT, BY THE PROCESSOR, AT LEAST SOME OF THE SUBBLOCKS OF CODED BITS
920

```
┌─────────────────────────────────────────────┐
│  PERFORM, BY A PROCESSOR OF AN APPARATUS, POLAR │
│  CODING TO ENCODE A PLURALITY OF INPUT SUBBLOCKS OF │
│  INFORMATION BITS, FROZEN BITS AND OPTIONAL CYCLIC │
│  REDUNDANCY CHECK (CRC) BITS TO GENERATE A PLURALITY │
│  OF SUBBLOCKS OF CODED BITS BY ADDITIONALLY FREEZING │
│  ONE OF THE PLURALITY OF INPUT SUBBLOCKS │
│  CORRESPONDING TO ONE OF THE INTERLEAVED PLURALITY │
│  OF SUBBLOCKS OF CODED BITS WHICH DECREASES │
│  POLARIZATION GAIN DUE TO PUNCTURING │
│  1010 │
└─────────────────────────────────────────────┘
                      │
                      ▼
┌─────────────────────────────────────────────┐
│  TRANSMIT, BY THE PROCESSOR, AT LEAST SOME OF THE │
│  SUBBLOCKS OF CODED BITS │
│  1020 │
└─────────────────────────────────────────────┘
```

FIG. 10

ADDITIONAL BIT FREEZING FOR POLAR CODING

CROSS REFERENCE TO RELATED PATENT APPLICATION(S)

The present disclosure is part of a non-provisional application claiming the priority benefit of U.S. Patent Application No. 63/063,567, 63/065,582, 63/068,419 and 63/072,980, filed on 10 Aug. 2020, 14 Aug. 2020, 21 Aug. 2020 and 1 Sep. 2020, respectively. Contents of aforementioned applications are incorporated by reference in their entirety.

TECHNICAL FIELD

The present disclosure is generally related to mobile communications and, more particularly, to additional bit freezing for polar coding in mobile communications.

BACKGROUND

Unless otherwise indicated herein, approaches described in this section are not prior art to the claims listed below and are not admitted as prior art by inclusion in this section.

In mobile communications based on the $3^{rd}$ Generation Partnership Project (3GPP) standards, polar codes are used as error-correction codes on 5th Generation (5G) New Radio (NR) control channels. However, there are issues related to subblock interleaver and rate-matching. For example, for polar coding with rate-matching where an interleaver is utilized for encoder output, part of input bits can be vulnerable to error and thereby degrading code block error performance. Moreover, the corresponding input bit which is punctured or shortened after rate-matching would negatively impact polarization effect on other input bits. Therefore, there is a need for a solution to address various issues described herein.

SUMMARY

The following summary is illustrative only and is not intended to be limiting in any way. That is, the following summary is provided to introduce concepts, highlights, benefits and advantages of the novel and non-obvious techniques described herein. Certain preferred implementations are further described below in the detailed description. Thus, the following summary is not intended to identify essential features of the claimed subject matter, nor is it intended for use in determining the scope of the claimed subject matter.

One objective of the present disclosure is propose schemes, concepts, designs, systems, methods and apparatus pertaining to additional bit freezing for polar coding in mobile communications. It is believed that the various schemes proposed herein with respect to additional freezing may be utilized for polar coding, for encoder input subblock(s), and for polar coding incremental-redundancy hybrid automatic repeat request (IR-HARQ) to improve overall system performance.

In one aspect, a method may involve performing polar coding to encode a plurality of input subblocks of information bits, frozen bits and optional cyclic redundancy check (CRC) bits to generate a plurality of subblocks of coded bits. The method may also involve transmitting at least some of the subblocks of coded bits. In performing the polar coding, the method may involve the following: (i) performing encoder input bit mapping and freezing on the plurality of input subblocks; (ii) additionally freezing one or more encoder input bit channels; and (iii) rate-matching and subblock interleaving the plurality of input subblocks to result in one or more punctured bits, one or more shortened bits, and one or more output bits as the at least some of the subblocks of coded bits that are transmitted.

In another aspect, a method may involve performing polar coding to encode a plurality of input subblocks of information bits, frozen bits and optional CRC bits to generate a plurality of subblocks of coded bits. The method may also involve transmitting at least some of the subblocks of coded bits. In performing the polar coding, the method may involve additionally freezing one of the plurality of input subblocks corresponding to one of the interleaved plurality of subblocks of coded bits which decreases polarization gain due to puncturing.

In still another aspect, an apparatus may include a transceiver and a processor coupled to the transceiver. The transceiver may be configured to communicate wirelessly. The processor may perform polar coding to encode a plurality of input subblocks of information bits, frozen bits and optional CRC bits to generate a plurality of subblocks of coded bits. The processor may also transmit, via the transceiver, at least some of the subblocks of coded bits. In performing the polar coding, the processor may perform the following: (i) performing encoder input bit mapping and freezing on the plurality of input subblocks; (ii) additionally freezing one or more encoder input bit channels; and (iii) rate-matching and subblock interleaving the plurality of input subblocks to result in one or more punctured bits, one or more shortened bits, and one or more output bits as the at least some of the subblocks of coded bits that are transmitted.

It is noteworthy that, although description provided herein may be in the context of certain radio access technologies, networks and network topologies such as 5G/NR mobile networking, the proposed concepts, schemes and any variation(s)/derivative(s) thereof may be implemented in, for and by other types of wireless and wired communication technologies, networks and network topologies such as, for example and without limitation, Ethernet, Evolved Packet System (EPS), Universal Terrestrial Radio Access Network (UTRAN), Evolved UTRAN (E-UTRAN), Global System for Mobile communications (GSM), General Packet Radio Service (GPRS)/Enhanced Data rates for Global Evolution (EDGE) Radio Access Network (GERAN), Long-Term Evolution (LTE), LTE-Advanced, LTE-Advanced Pro, Internet-of-Things (IoT), Industrial IoT (IIoT), Narrow Band Internet of Things (NB-IoT), and any future-developed networking technologies. Thus, the scope of the present disclosure is not limited to the examples described herein.

BRIEF DESCRIPTION OF THE DRAWINGS

The accompanying drawings are included to provide a further understanding of the disclosure and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

FIG. 9 is a flowchart of an example process in accordance with an implementation of the present disclosure.

FIG. 10 is a flowchart of an example process in accordance with an implementation of the present disclosure.

DETAILED DESCRIPTION OF PREFERRED IMPLEMENTATIONS

Detailed embodiments and implementations of the claimed subject matters are disclosed herein. However, it shall be understood that the disclosed embodiments and implementations are merely illustrative of the claimed subject matters which may be embodied in various forms. The present disclosure may, however, be embodied in many different forms and should not be construed as limited to the exemplary embodiments and implementations set forth herein. Rather, these exemplary embodiments and implementations are provided so that description of the present disclosure is thorough and complete and will fully convey the scope of the present disclosure to those skilled in the art. In the description below, details of well-known features and techniques may be omitted to avoid unnecessarily obscuring the presented embodiments and implementations.

Overview

Implementations in accordance with the present disclosure relate to various techniques, methods, schemes and/or solutions pertaining to additional bit freezing for polar coding in mobile communications. According to the present disclosure, a number of possible solutions may be implemented separately or jointly. That is, although these possible solutions may be described below separately, two or more of these possible solutions may be implemented in one combination or another.

Figure 1:
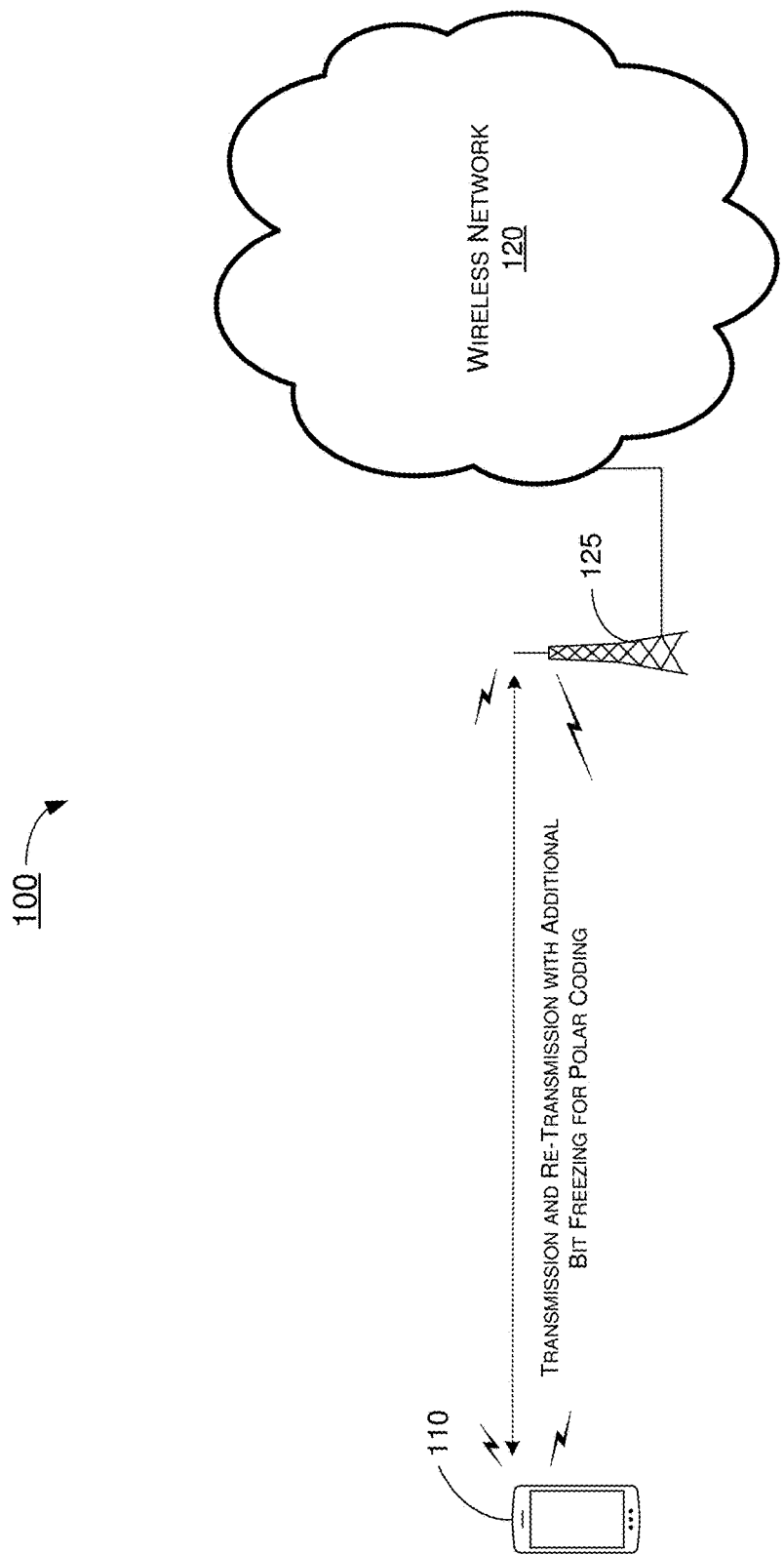
FIG. 1 is a diagram of an example network environment in which various solutions and schemes in accordance with the present disclosure may be implemented.

FIG. 1 illustrates an example network environment 100 in which various solutions and schemes in accordance with the present disclosure may be implemented. Referring to FIG. 1, network environment 100 may involve a user equipment (UE) 110 and a wireless network 120. UE 110 and network 120 may be in wireless communications via one or more network nodes (e.g., eNBs, gNBs and/or transmit/receive points (TRPs)) including a network node 125. In network environment 100, UE 110 and wireless network 120 may be configured to implement various schemes pertaining to additional bit freezing for polar coding in mobile communications in accordance with the present disclosure, as described herein.

When either UE 110 or network node 125 performs HARQ transmissions, an initial transmission and its associated retransmission(s) may be generated from a joint polar code with a larger size of N'. For instance, N'=2N when N is the polar code size for the initial transmission (e.g., for N=32, N'=2N=64; or for N=16, N'=2N=32), with a part of a plurality of information bits carried in the initial transmission selected to be carried in a retransmission.

Figure 2:
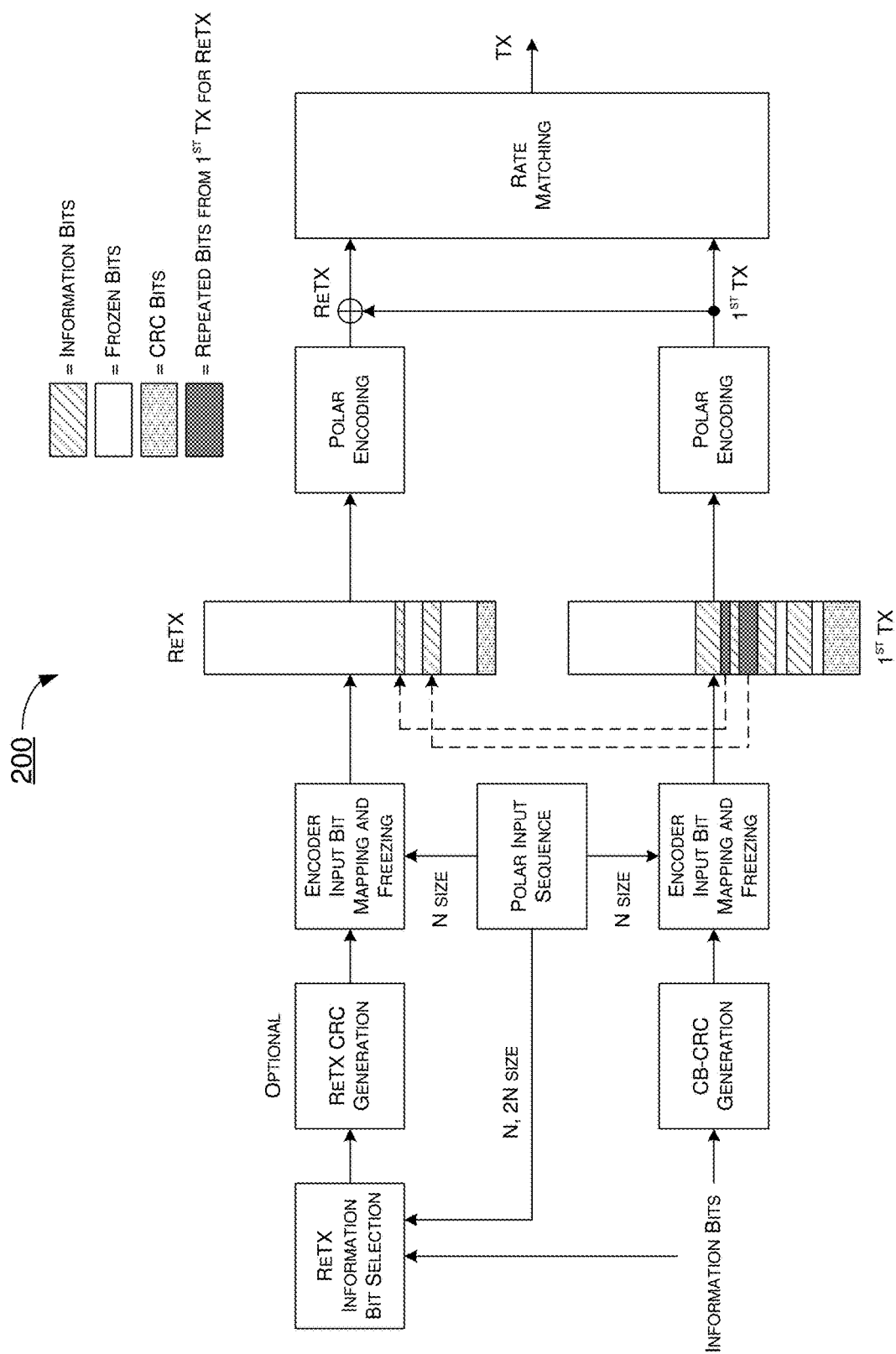
FIG. 2 is a diagram of an example design in an implementation under a proposed scheme in accordance with the present disclosure.

FIG. 2 illustrates an example design 200 in which various proposed schemes in accordance with the present disclosure may be implemented. In design 200, for an initial transmission (denoted as "$1^{st}$ TX" in FIG. 2), a code block cyclic redundancy check (CB CRC) may be generated with a plurality of information bits to be transmitted as input. For instance, the CB CRC may be generated as an NR physical downlink shared channel (PDSCH) CB CRC. Then, encoder input bit mapping and freezing may be performed based on the CB CRC and a polar input sequence of a size N to generate a size-N polar sub-code carrying the information bits, which is shown in the lower portion of FIG. 2. The encoder input bit mapping and freezing functional block may receive an input from the polar input sequence functional block that indicates the size of a polar CB to be generated as N bits (e.g., for the lower polar sub-code). The size-N polar sub-code carrying the information bits may then be processed by a polar encoder (or a polar encoding functional block) to generate a size-N initial polar code to be rate-matched, interleaved and selected for transmission.

In design 200, for retransmission, one or more unreliable bits for the initial transmission may be selected from the plurality of information bits as one or more retransmission information bits. For instance, selection of the one or more retransmission information bits may be based on a second polar input sequence or a lookup table as a function of K, N and/or E. The retransmission (ReTX) information bit selection functional block may also receive an input from the polar input sequence functional block that indicates the size of a polar CB to be generated as either N bits (e.g., for the initial transmission) or 2N bits (e.g., for the retransmission). As an option, the one or more retransmission information bits may be utilized in generating a retransmission CRC (ReTX CRC). Then, encoder input bit mapping and freezing may be performed based on the one or more retransmission information bits (or the ReTX CRC if available) and the same polar input sequence (used for the initial transmission) to generate a size-N polar sub-code carrying the one or more retransmission information bits for IR-HARQ, which is shown in the lower portion of FIG. 2. The encoder input bit mapping and freezing functional block may receive an input from the polar input sequence functional block that indicates the size of a polar CB to be generated as N bits (e.g., for the upper polar sub-code). The size-N polar sub-code carrying the one or more retransmission information bits may then be processed by polar encoding to generate a size-2N retransmission polar code to be rate-matched and transmitted. In design 200, the output of the lower polar encoding functional block and the output of the upper polar encoding functional block may be XOR'd so that one size-N polar CB is provided as input to the rate-matching function block. For reduction in overhead and decoding complexity, the retransmission may include ReTX CRC, which has a size smaller than (e.g., fewer bits) than that of the CB CRC.

For polar coding with rate-matching where an interleaver is utilized for encoder output, part of input bits can be vulnerable to error, thereby degrading code block error performance. Moreover, the corresponding input bit which is punctured or shortened after rate-matching would negatively impact polarization effect on other input bits. These impacted bits thus need to be additionally frozen to preserve system performance. In that regard, several issues that can be observed in cases where some of the rate-matched and interleaved subblocks are punctured and/or shortened (e.g., E<N, with E representing the transmitted bits after rate-matching and N representing the polar mother code size for retransmission), and corresponding proposed solutions, are described below.

A first issue is that the bits in an encoder input subblock corresponding to a subblock of the least indexed subblock in retransmission (e.g., for HARQ) are vulnerable in an event that the amount is small with respect to the subblock size. For instance, in an event that the amount is less than $\alpha$ (e.g., $\alpha=\frac{1}{2}$) of a subblock size (N/32 with N being the polar mother code size for the initial transmission), then the first issue may likely occur.

Figure 3:
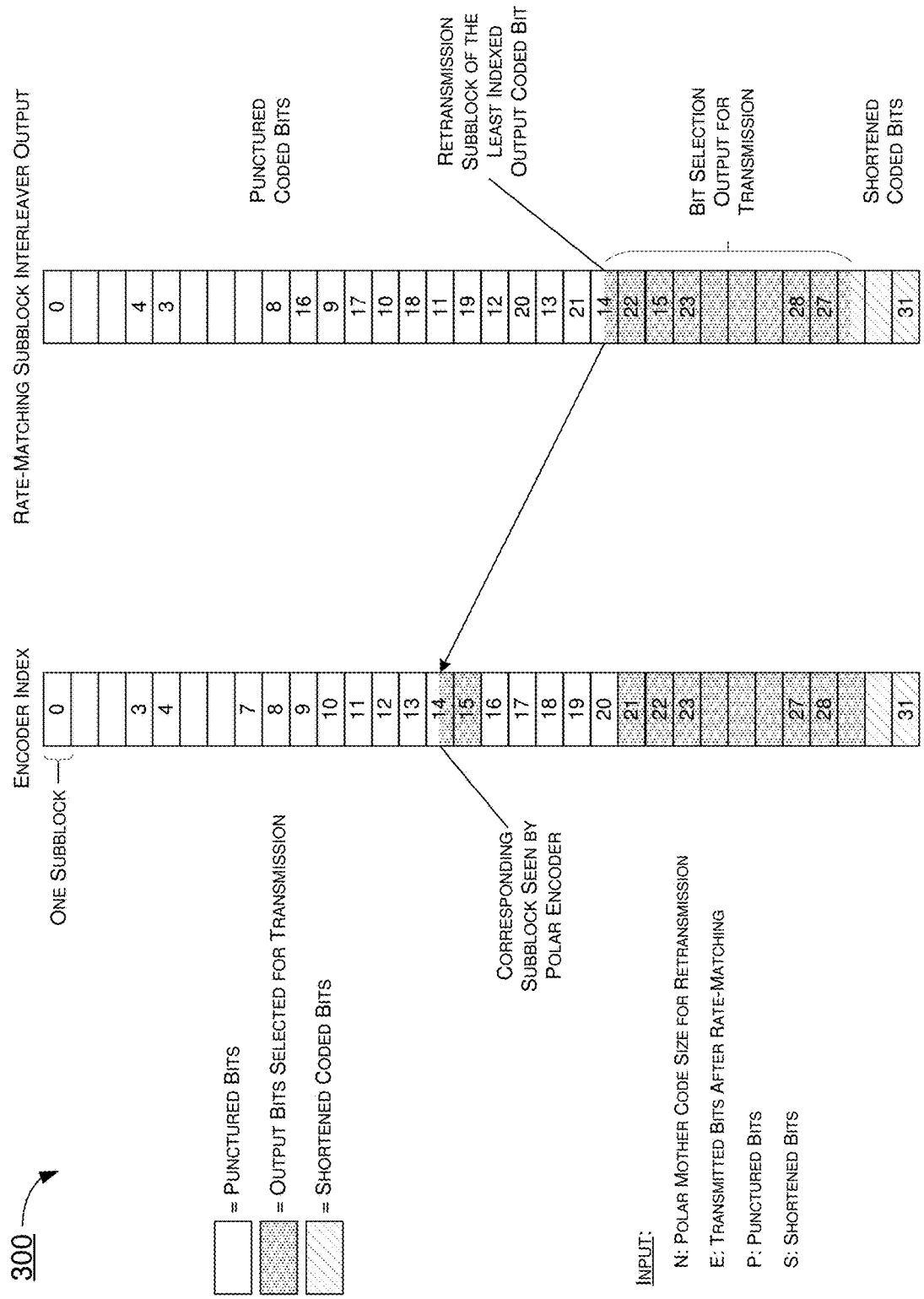
FIG. 3 is a diagram of an example scenario under a proposed scheme in accordance with the present disclosure.

Under a first proposed scheme in accordance with the present disclosure regarding the first issue, an implementation of the proposed scheme may additionally free a corresponding subblock in the polar encoder input so as to avoid the vulnerable bits. For instance, in case an i-th subblock of coded bits for retransmission is of the least indexed bit and has a size less than or smaller than a threshold (e.g., with a bit number<N/64), then the P(i)-th subblock of bits in the encoder input may be additionally frozen. The values defined in Table 5.4.1.1-1 of 3GPP Technical Specification (TS) 38.212 may be used as values of P(i) in case NR rate-matching is reused. FIG. 3 illustrates an example scenario 300 under the first proposed scheme in accordance with the present disclosure. In scenario 300, the column of subblocks on the left represent encoder input subblocks of information bits. Moreover, the column of subblocks on the right represent rate-matching and subblock interleaver output subblocks of coded bits, including some punctured coded bits, output bits for transmission as a result of bit selection for transmission, and shortened coded bits. In scenario 300, polar encoding may involve additionally freezing a corresponding subblock in the polar encoder input to avoid vulnerable bits.

A second issue is that, in case the total number of punctured or shortened coded bits for a retransmission is more than a certain portion (e.g., ¾) of the polar mother code size for a corresponding initial transmission (herein denoted as "N"), polar code structure for the retransmission may be degraded and thus may cause significant loss in performance.

Under a second proposed scheme in accordance with the present disclosure regarding the second issue, information bits for retransmission may be forced or otherwise set to zero to effectively result in chase-combining (CC)-HARQ for the case of shortening of initial transmission. For instance, in case of N=4096, the number of shortened bits=200, the number of punctured bits=3000, then the number of information bits for retransmission may be set to 0 and, accordingly, only CC-HARQ may be performed.

A third issue is that it is more likely for error to occur in the input bit positions with index smaller than N/2 when the number of punctured bits (from smaller index to larger index) is larger than N/2, where N is the polar code size seen by the rate-matching interleaver. That is, in case the number of punctured coded bits is large, then polarization for the subblock of the smallest indexed subblock seen by the polar encoder may be weak since no upper subblock would be decoded first to provide combining gain to it.

Figure 4:
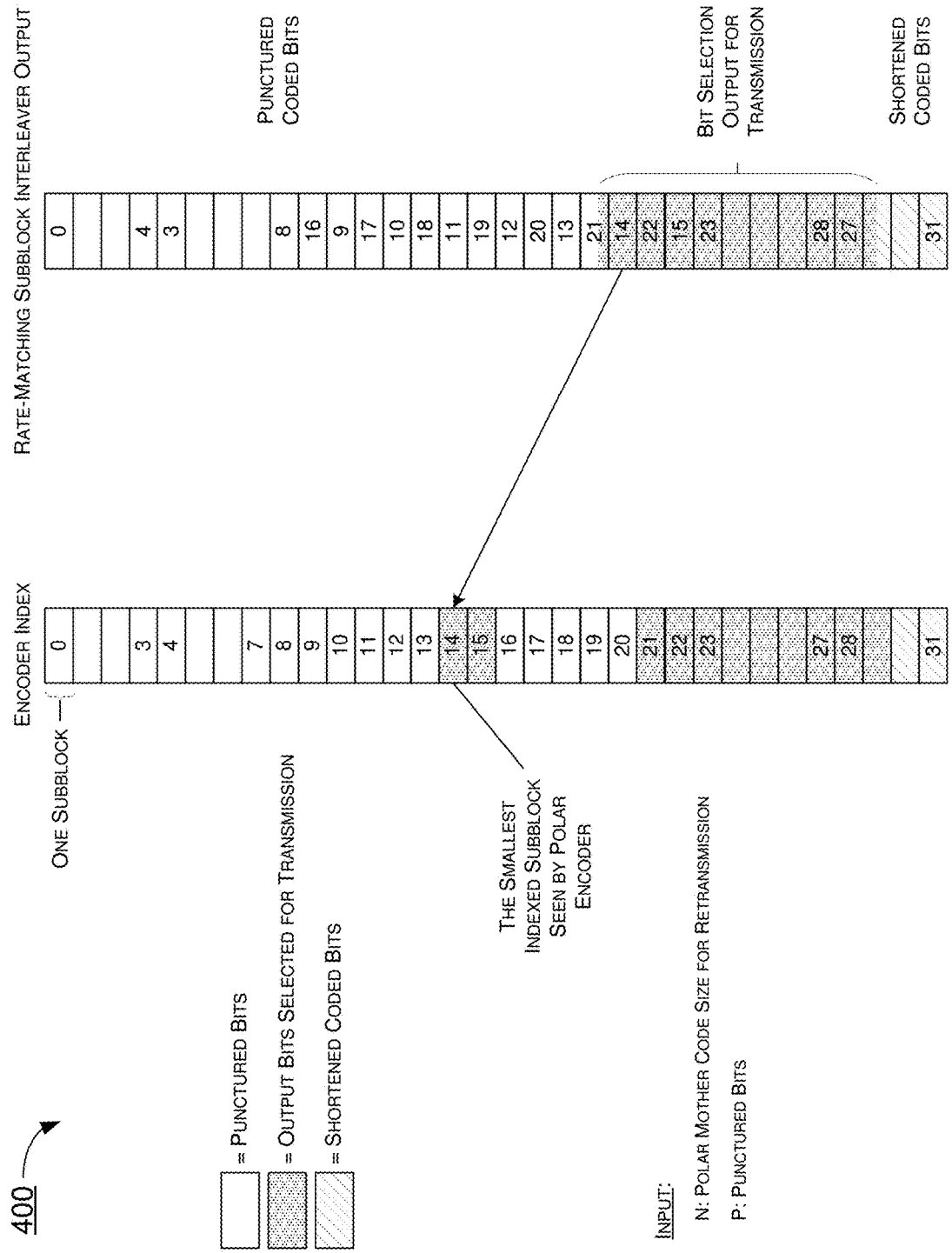
FIG. 4 is a diagram of an example scenario under a proposed scheme in accordance with the present disclosure.

Under a third proposed scheme in accordance with the present disclosure regarding the third issue, in case the number of punctured bits is larger than N/2, where N is the polar code size seen by rate-matching interleaver, polar encoding may involve additionally freezing the smallest N/2 bit positions of the corresponding encoder input subblocks of information bits. FIG. 4 illustrates an example scenario 400 under the third proposed scheme in accordance with the present disclosure. In scenario 400, the column of subblocks on the left represent encoder input subblocks of information bits. Moreover, the column of subblocks on the right represent rate-matching and subblock interleaver output subblocks of coded bits, including some punctured coded bits, output bits for transmission as a result of bit selection for transmission, and shortened coded bits. In scenario 400, polar encoding may involve additionally freezing the smallest N/2 bit positions of the corresponding encoder input subblocks of information bits.

A fourth issue is that it is more likely for error to occur in the input subblock corresponding to the interleaved subblock of the bit of the smallest index. That is, the encoder input subblock corresponding to the interleaved subblock of the smallest indexed output bit may have less polarization gain since there can be no connected subblock with smaller input bit index.

Figure 5:
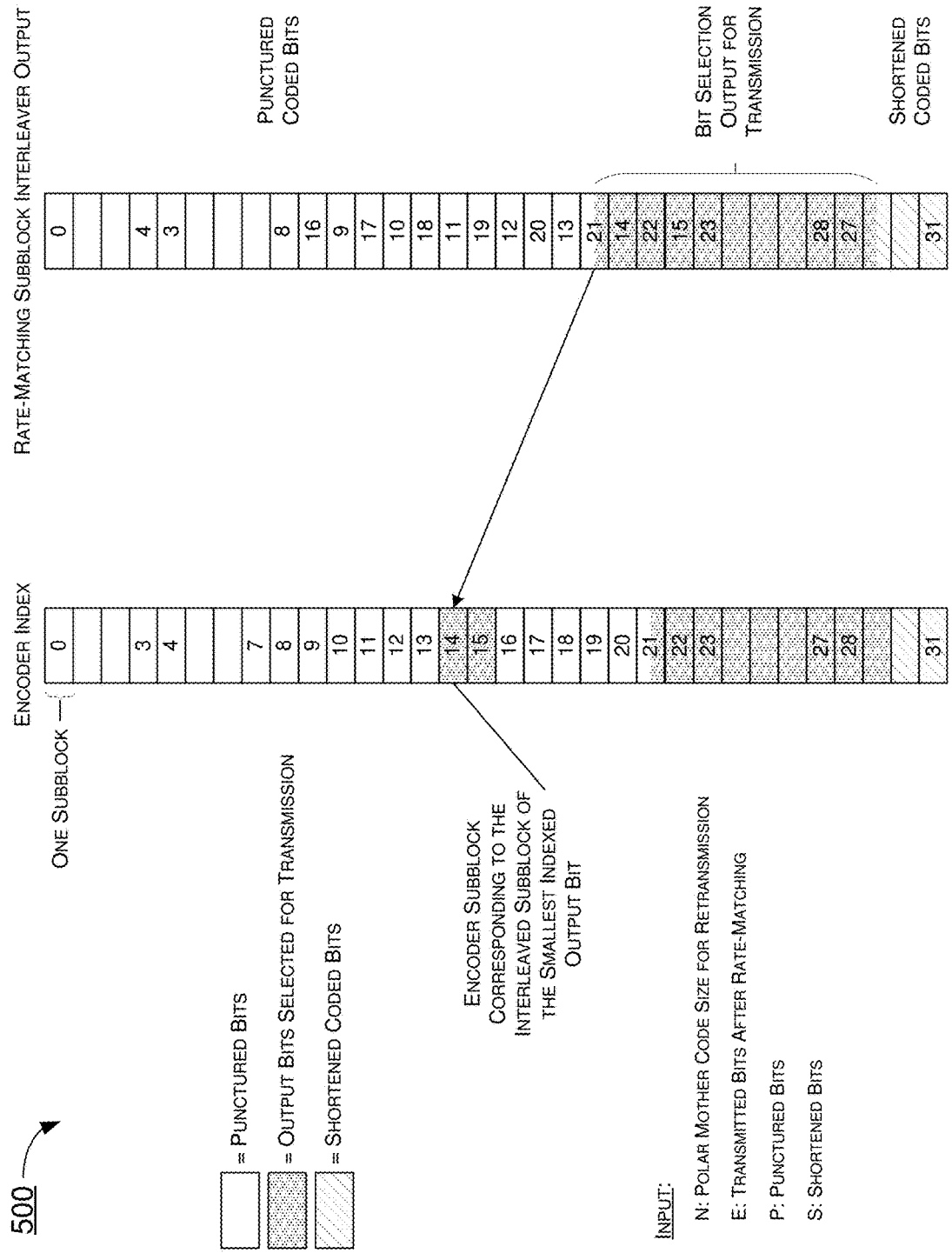
FIG. 5 is a diagram of an example scenario under a proposed scheme in accordance with the present disclosure.

Under a fourth proposed scheme in accordance with the present disclosure regarding the fourth issue, the polar encoder may additionally freeze the encoder input subblock corresponding to the interleaved subblock of the smallest indexed output bit. FIG. 5 illustrates an example scenario 500 under the fourth proposed scheme in accordance with the present disclosure. In scenario 500, the column of subblocks on the left represent encoder input subblocks of information bits. Moreover, the column of subblocks on the right represent rate-matching and subblock interleaver output subblocks of coded bits, including some punctured coded bits, output bits for transmission as a result of bit selection for transmission, and shortened coded bits. In scenario 500, polar encoding may involve additionally freezing the encoder input subblock corresponding to the interleaved subblock of the smallest indexed output bit.

A fifth issue is that incremental redundancy (IR) performance tends to become comparable or worse than chase-combining (CC) when the number of punctured bits reaches ¾ of N. Furthermore, IR performance tends to suffer from serious degradation when the number of punctured bits reaches ⅜ of N. It is observed that the performance can be recovered in an event that the effective code length is reduced to N/2 (e.g., by placing information bits in lower N/2 code while using upper N/2 code merely for CC repetition).

Figure 6:
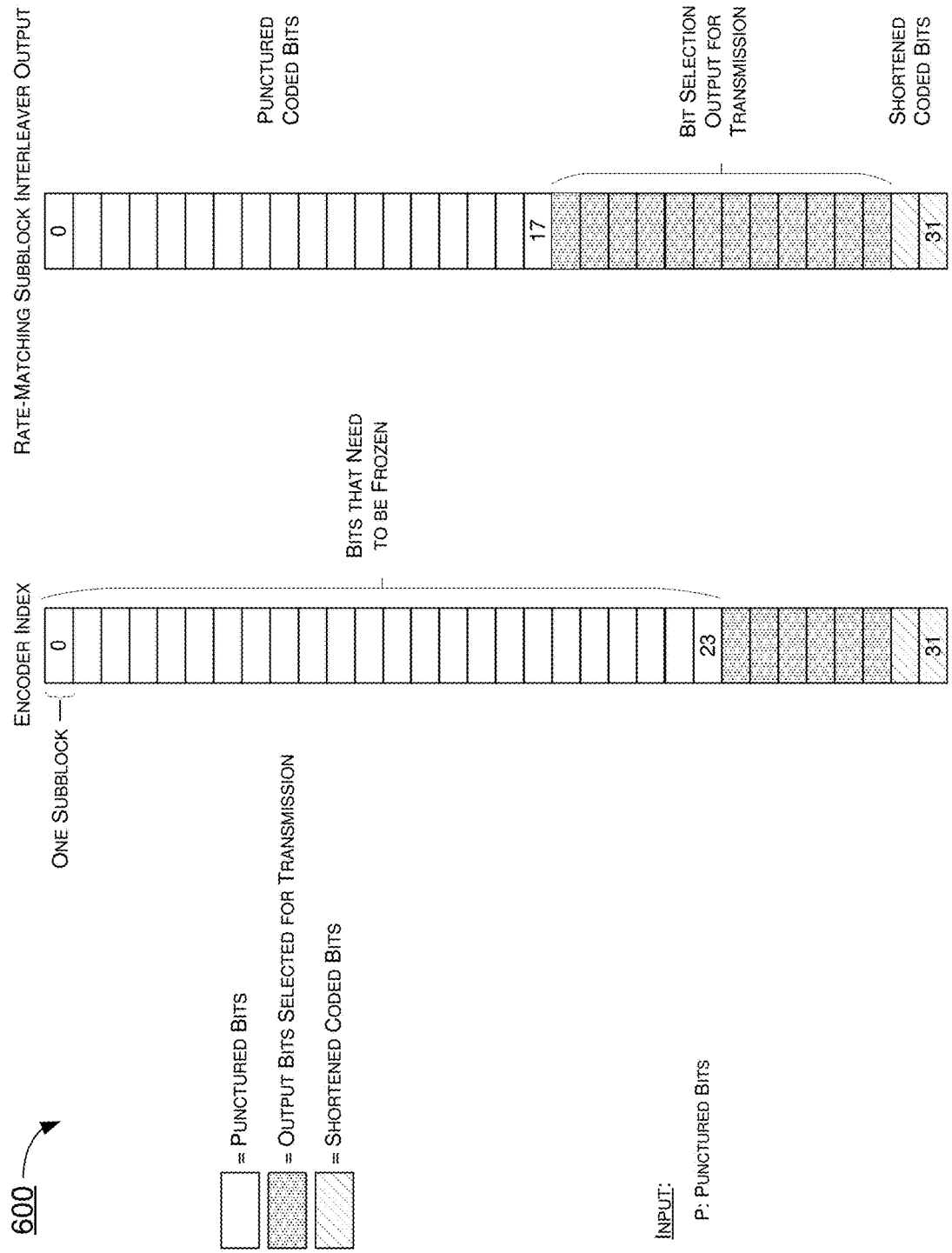
FIG. 6 is a diagram of an example scenario summary under a proposed scheme in accordance with the present disclosure.

Under a fifth proposed scheme in accordance with the present disclosure regarding the fifth issue, regarding the observed issue for the punctured bits (assuming a number of the punctured bits is P) which causes performance degradation, the bits in the encoder input may be additionally frozen from 0 to $\lceil 4/3P \rceil - 1$. For instance, in case of P=3N/4, then an implementation of the fifth proposed scheme may additionally freeze the bit index at the polar encoder input from 0 to N−1. As another example, in case of P=3N/8, then polar encoding may involve additionally freezing the bit index at the polar encoder input from 0 to N/2−1. It is noteworthy that, in various implementations, the factor 4/3 may be replaced by an approximated fraction with a denominator that is to the power of 2 (e.g., 21/16 or 22/16). Moreover, the maximum bound of freezing bits may be bound by code length N. FIG. 6 illustrates an example scenario 600 under the fifth proposed scheme in accordance with the present disclosure. In scenario 600, the column of subblocks on the left represent encoder input subblocks of information bits. Moreover, the column of subblocks on the right represent rate-matching and subblock interleaver output subblocks of coded bits, including some punctured coded bits, output bits for transmission as a result of bit selection for transmission, and shortened coded bits. In scenario 600, bits 0~23 in the column of encoder input subblocks of information bits may be additionally frozen to resolve the issue.

A sixth issue is that it is more likely for error to occur in the input subblock corresponding to the interleaved subblock which contains the largest index of punctured bits. That is, the encoder input subblock corresponding to the interleaved subblock which contains the largest index of punctured bits tends to have less polarization gain since there can be no connected subblock with smaller input bit index.

Figure 7:
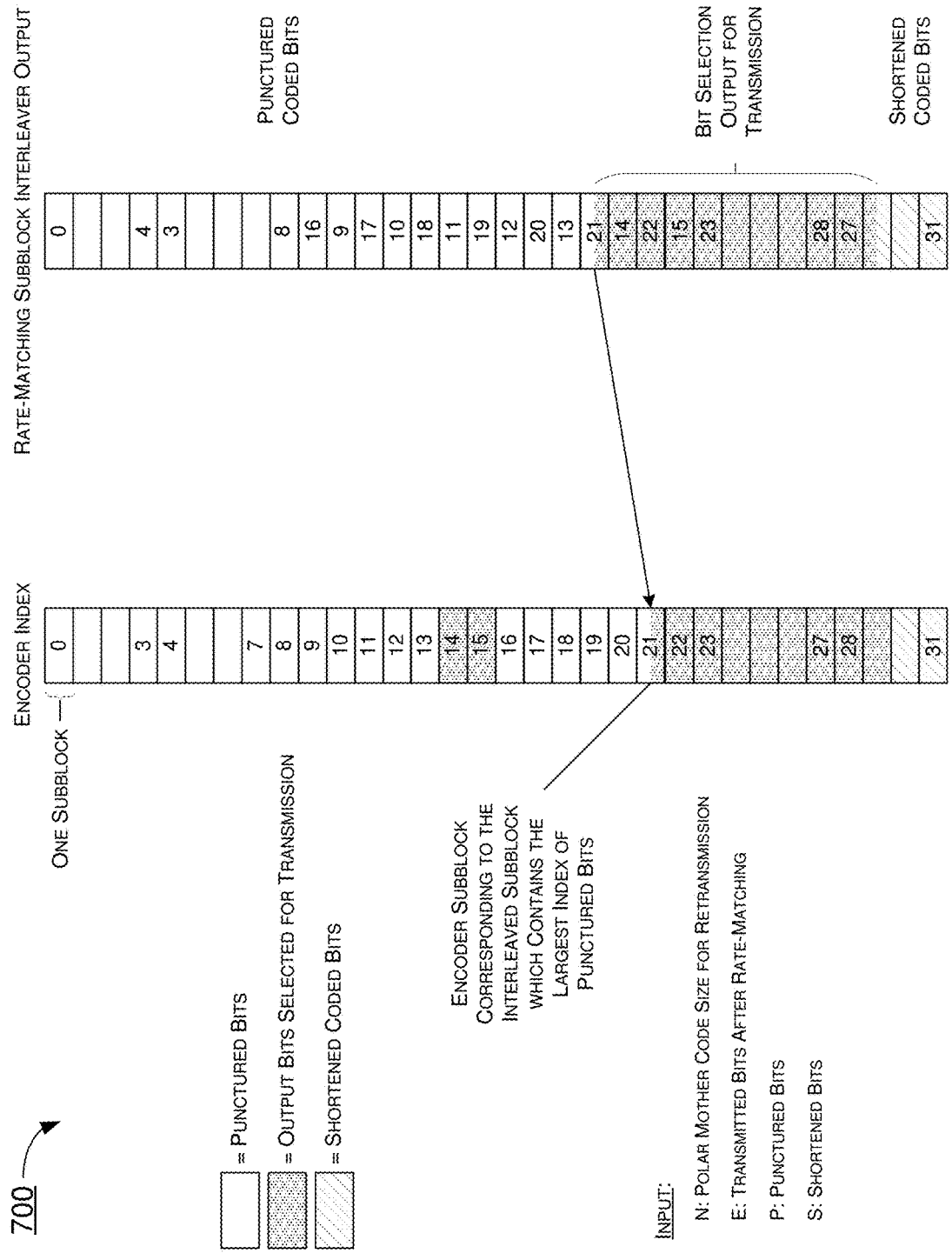
FIG. 7 is a diagram of an example scenario under a proposed scheme in accordance with the present disclosure.

Under a sixth proposed scheme in accordance with the present disclosure regarding the sixth issue, polar encoding may involve additionally freezing the encoder input subblock corresponding to the interleaved subblock containing the largest index of punctured bits. To achieve extra enhancement, polar encoding may involve additionally freezing the encoder input subblock corresponding to the interleaved subblock containing the largest index of punctured bits plus additional following one or more subblocks. FIG. 7 illustrates an example scenario 700 under the sixth proposed scheme in accordance with the present disclosure. In scenario 700, the column of subblocks on the left represent encoder input subblocks of information bits. Moreover, the column of subblocks on the right represent rate-matching and subblock interleaver output subblocks of coded bits, including some punctured coded bits, output bits for transmission as a result of bit selection for transmission, and shortened coded bits. In scenario 700, the encoder input subblock corresponding to the interleaved subblock which contains the largest index of punctured bits (and, optionally, following one or more subblocks) may be additionally frozen.

Illustrative Implementations

Figure 8:
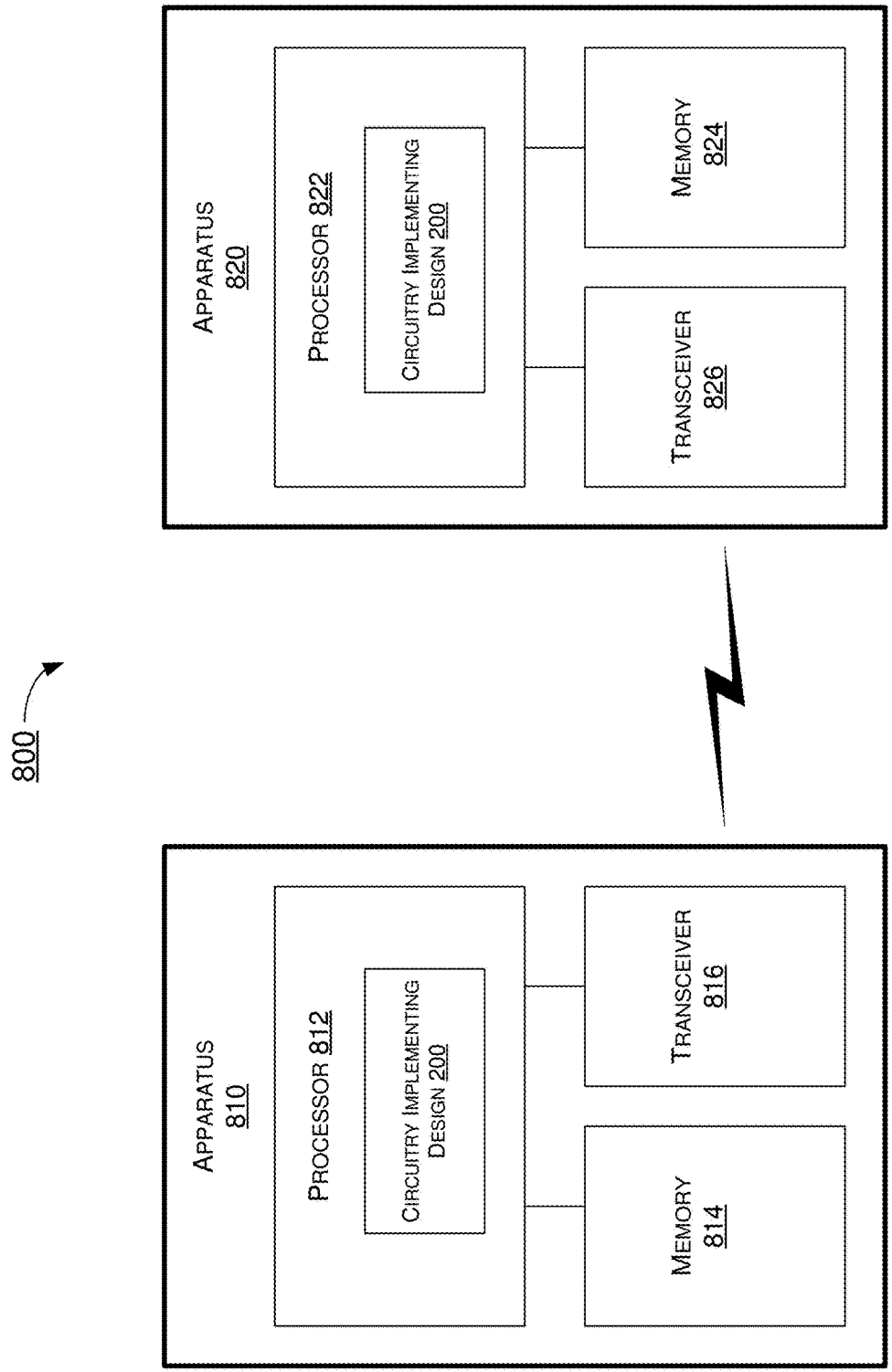
FIG. 8 is a block diagram of an example communication system in accordance with an implementation of the present disclosure.

FIG. 8 illustrates an example communication system 800 having at least an example apparatus 810 and an example apparatus 820 in accordance with an implementation of the present disclosure. Each of apparatus 810 and apparatus 820 may perform various functions to implement schemes, techniques, processes and methods described herein pertaining to additional bit freezing for polar coding in mobile communications, including the various schemes described above with respect to various proposed designs, concepts, schemes, systems and methods described above, including network environment 100, as well as processes described below.

Each of apparatus 810 and apparatus 820 may be a part of an electronic apparatus, which may be a network apparatus or a UE (e.g., UE 110), such as a portable or mobile apparatus, a wearable apparatus, a vehicular device or a vehicle, a wireless communication apparatus or a computing apparatus. For instance, each of apparatus 810 and apparatus 820 may be implemented in a smartphone, a smart watch, a personal digital assistant, an electronic control unit (ECU) in a vehicle, a digital camera, or a computing equipment such as a tablet computer, a laptop computer or a notebook computer. Each of apparatus 810 and apparatus 820 may also be a part of a machine type apparatus, which may be an IoT apparatus such as an immobile or a stationary apparatus, a home apparatus, a roadside unit (RSU), a wire communication apparatus or a computing apparatus. For instance, each of apparatus 810 and apparatus 820 may be implemented in a smart thermostat, a smart fridge, a smart door lock, a wireless speaker or a home control center. When implemented in or as a network apparatus, apparatus 810 and/or apparatus 820 may be implemented in an eNodeB in an LTE, LTE-Advanced or LTE-Advanced Pro network or in a gNB or TRP in a 5G network, an NR network or an IoT network.

In some implementations, each of apparatus 810 and apparatus 820 may be implemented in the form of one or more integrated-circuit (IC) chips such as, for example and without limitation, one or more single-core processors, one or more multi-core processors, one or more complex-instruction-set-computing (CISC) processors, or one or more reduced-instruction-set-computing (RISC) processors. In the various schemes described above, each of apparatus 810 and apparatus 820 may be implemented in or as a network apparatus or a UE. Each of apparatus 810 and apparatus 820 may include at least some of those components shown in FIG. 8 such as a processor 812 and a processor 822, respectively, for example. Each of apparatus 810 and apparatus 820 may further include one or more other components not pertinent to the proposed scheme of the present disclosure (e.g., internal power supply, display device and/or user interface device), and, thus, such component(s) of apparatus 810 and apparatus 820 are neither shown in FIG. 8 nor described below in the interest of simplicity and brevity.

In one aspect, each of processor 812 and processor 822 may be implemented in the form of one or more single-core processors, one or more multi-core processors, or one or more CISC or RISC processors. That is, even though a singular term "a processor" is used herein to refer to processor 812 and processor 822, each of processor 812 and processor 822 may include multiple processors in some implementations and a single processor in other implementations in accordance with the present disclosure. In another aspect, each of processor 812 and processor 822 may be implemented in the form of hardware (and, optionally, firmware and/or middleware) with electronic components including, for example and without limitation, one or more transistors, one or more diodes, one or more capacitors, one or more resistors, one or more inductors, one or more memristors and/or one or more varactors that are configured and arranged to achieve specific purposes in accordance with the present disclosure. In other words, in at least some implementations, each of processor 812 and processor 822 is a special-purpose machine specifically designed, arranged and configured to perform specific tasks including those pertaining to additional bit freezing for polar coding in mobile communications in accordance with various implementations of the present disclosure. For instance, each of processor 812 and processor 822 may have respective circuitry with hardware components (and, optionally, firmware and/or middleware) configured to implement design 200 to address various issues described herein by implementing various proposed schemes in accordance with the present disclosure, including those described above with respect to FIG. 3~FIG. 7.

In some implementations, apparatus 810 may also include a transceiver 816 coupled to processor 812. Transceiver 816 may be capable of wirelessly transmitting and receiving data. In some implementations, transceiver 816 may be capable of wirelessly communicating with different types of wireless networks of different radio access technologies (RATs). In some implementations, transceiver 816 may be equipped with a plurality of antenna ports (not shown) such as, for example, four antenna ports. That is, transceiver 816 may be equipped with multiple transmit antennas and multiple receive antennas for multiple-input multiple-output (MIMO) wireless communications. In some implementations, apparatus 820 may also include a transceiver 826 coupled to processor 822. Transceiver 826 may include a transceiver capable of wirelessly transmitting and receiving data. In some implementations, transceiver 826 may be capable of wirelessly communicating with different types of UEs/wireless networks of different RATs. In some implementations, transceiver 826 may be equipped with a plurality of antenna ports (not shown) such as, for example, four antenna ports. That is, transceiver 826 may be equipped with multiple transmit antennas and multiple receive antennas for MIMO wireless communications.

In some implementations, apparatus 810 may further include a memory 814 coupled to processor 812 and capable of being accessed by processor 812 and storing data therein. In some implementations, apparatus 820 may further include a memory 824 coupled to processor 822 and capable of being accessed by processor 822 and storing data therein. Each of memory 814 and memory 824 may include a type of random-access memory (RAM) such as dynamic RAM (DRAM), static RAM (SRAM), thyristor RAM (T-RAM) and/or zero-capacitor RAM (Z-RAM). Alternatively, or additionally, each of memory 814 and memory 824 may include a type of read-only memory (ROM) such as mask ROM, programmable ROM (PROM), erasable programmable ROM (EPROM) and/or electrically erasable programmable ROM (EEPROM). Alternatively, or additionally, each of memory 814 and memory 824 may include a type of non-volatile random-access memory (NVRAM) such as flash memory, solid-state memory, ferroelectric RAM (Fe-RAM), magnetoresistive RAM (MRAM) and/or phase-change memory. Alternatively, or additionally, each of memory 814 and memory 824 may include a UICC.

Each of apparatus 810 and apparatus 820 may be a communication entity capable of communicating with each other using various proposed schemes in accordance with the present disclosure. For illustrative purposes and without limitation, a description of capabilities of apparatus 810, as a UE (e.g., UE 110), and apparatus 820, as a network node (e.g., network node 35) of a wireless network (e.g., wireless network 30), is provided below.

Under a proposed scheme in accordance with the present disclosure with respect to additional bit freezing for polar coding in mobile communications, processor 812 of apparatus 810, implemented in or as UE 110, may perform polar coding to encode a plurality of input subblocks of information bits and frozen bits (and CRC bits, if any) to generate a plurality of subblocks of coded bits. Similarly, processor 822 of apparatus 820, implemented in or as network node 125, may perform polar coding to encode a plurality of input subblocks of information bits and frozen bits (and CRC bits, if any) to generate a plurality of subblocks of coded bits. Then, processor 812 may transmit, via transceiver 816, to apparatus 820 at least some of the subblocks of coded bits. Likewise, processor 822 may transmit, via transceiver 826, to apparatus 810 at least some of the subblocks of coded bits. In performing the polar coding, each of processor 812 and processor 822 may perform certain operations. For instance, each of processor 812 and processor 822 may perform encoder input bit mapping and freezing on the plurality of input subblocks. Moreover, each of processor 812 and processor 822 may additionally freeze one or more encoder input bit channels. Furthermore, each of processor 812 and processor 822 may rate-match and subblock interleave the plurality of input subblocks to result in one or more punctured bits that are punctured, one or more shortened bits that are shortened, and one or more output bits as the at least some of the subblocks of coded bits that are transmitted.

In some implementations, in performing the polar coding, each of processor 812 and processor 822 may perform the polar coding in an IR-HARQ procedure. In such cases, in transmitting, each of processor 812 and processor 822 may perform a retransmission in the IR-HARQ procedure.

In some implementations, in additionally freezing the one or more encoder input bit channels, each of processor 812 and processor 822 may additionally freeze one of the plurality of input subblocks corresponding to one of the interleaved plurality of subblocks of coded bits containing a largest index of punctured bits compared to indexes of punctured bits contained in other ones of the interleaved plurality of subblocks of coded bits.

In some implementations, in additionally freezing the one or more encoder input bit channels, each of processor 812 and processor 822 may additionally freeze one of the plurality of input subblocks corresponding to one of the interleaved plurality of subblocks of coded bits containing a smallest index of output bits compared to indexes of output bits contained in other ones of the interleaved plurality of subblocks of coded bits.

In some implementations, in additionally freezing the one or more encoder input bit channels, each of processor 812 and processor 822 may additionally freeze one of the plurality of input subblocks corresponding to one of the interleaved plurality of subblocks of coded bits containing a least indexed bit and having a size less than a threshold.

In some implementations, in additionally freezing the one or more encoder input bit channels, each of processor 812 and processor 822 may set information bits in one or more of the plurality of input subblocks for a retransmission to zero responsive to a number of the one or more punctured bits or a number of the one or more shortened bits for the retransmission being more than a portion of a polar mother code size used in polar coding for an initial transmission corresponding to the retransmission.

In some implementations, in additionally freezing the one or more encoder input bit channels, each of processor 812 and processor 822 may additionally freeze smallest N/2 bit positions of the plurality of input subblocks responsive to a number of the one or more punctured bits being larger than N/2. In such cases, N may denote a polar code size seen by a rate-matching interleaver that performs the rate-matching and subblock interleaving.

In some implementations, in additionally freezing the one or more encoder input bit channels, each of processor 812 and processor 822 may additionally freeze information bits of the plurality of input subblocks with indexes ranging from 0 to $\lceil 4/3P \rceil - 1$. In such cases, P may denote a number of punctured bits in the one or more subblocks of punctured bits.

Under another proposed scheme in accordance with the present disclosure with respect to additional bit freezing for polar coding in mobile communications, processor 812 of apparatus 810, implemented in or as UE 110, may perform polar coding to encode a plurality of input subblocks of information bits and frozen bits (and CRC bits, if any) to generate a plurality of subblocks of coded bits. Similarly, processor 822 of apparatus 820, implemented in or as network node 125, may perform polar coding to encode a plurality of input subblocks of information bits and frozen bits (and CRC bits, if any) to generate a plurality of subblocks of coded bits. Then, processor 812 may transmit, via transceiver 816, to apparatus 820 at least some of the subblocks of coded bits. Likewise, processor 822 may transmit, via transceiver 826, to apparatus 810 at least some of the subblocks of coded bits. In performing the polar coding, each of processor 812 and processor 822 may perform certain operations. For instance, each of processor 812 and processor 822 may additionally freeze one of the plurality of input subblocks corresponding to one of the interleaved plurality of subblocks of coded bits which decreases polarization gain due to puncturing.

In some implementations, in additionally freezing one of the plurality of input subblocks, each of processor 812 and processor 822 may additionally freeze one of the plurality of input subblocks corresponding to one of the interleaved plurality of subblocks of coded bits containing a largest index of punctured bits compared to indexes of punctured bits contained in other ones of the interleaved plurality of subblocks of coded bits.

In some implementations, in additionally freezing one of the plurality of input subblocks, each of processor 812 and processor 822 may additionally freeze one of the plurality of input subblocks corresponding to one of the interleaved plurality of subblocks of coded bits containing a smallest index of output bits compared to indexes of output bits contained in other ones of the interleaved plurality of subblocks of coded bits.

In some implementations, in performing the polar coding, each of processor 812 and processor 822 may perform the polar coding in an IR-HARQ procedure. In such cases, in transmitting, each of processor 812 and processor 822 may perform a retransmission in the IR-HARQ procedure. Moreover, in performing the polar coding, each of processor 812 and processor 822 may perform some operations. For instance, each of processor 812 and processor 822 may perform encoder input bit mapping and freezing on the plurality of input subblocks. Furthermore, each of processor 812 and processor 822 may rate-match and subblock interleave the plurality of input subblocks to result in one or more punctured bits that are punctured, one or more shortened bits that are shortened, and one or more output bits as the at least some of the subblocks of coded bits that are transmitted.

Illustrative Processes

FIG. 9 illustrates an example process 900 in accordance with an implementation of the present disclosure. Process 900 may represent an aspect of implementing various proposed designs, concepts, schemes, systems and methods described above, whether partially or entirely, including those described above. More specifically, process 900 may represent an aspect of the proposed concepts and schemes pertaining to additional bit freezing for polar coding in mobile communications. Process 900 may include one or more operations, actions, or functions as illustrated by one or more of blocks 910 and 920. Although illustrated as discrete blocks, various blocks of process 900 may be divided into additional blocks, combined into fewer blocks, or eliminated, depending on the desired implementation. Moreover, the blocks/subblocks of process 900 may be executed in the order shown in FIG. 9 or, alternatively in a different order. Furthermore, one or more of the blocks/subblocks of process 900 may be executed iteratively. Process 900 may be implemented by or in apparatus 810 and apparatus 820 as well as any variations thereof. Solely for illustrative purposes and without limiting the scope, process 900 is described below in the context of apparatus 810 as a UE (e.g., UE 110) and apparatus 820 as a communication entity such as a network node or base station (e.g., network node 125) of a wireless network (e.g., wireless network 120). Process 900 may begin at block 910.

At 910, process 900 may involve processor 812 of apparatus 810, implemented in or as UE 110, performing polar coding to encode a plurality of input subblocks of information bits and frozen bits (and CRC bits, if any) to generate a plurality of subblocks of coded bits. Similarly, process 900 may involve processor 822 of apparatus 820, implemented in or as network node 125, performing polar coding to encode a plurality of input subblocks of information bits and frozen bits (and CRC bits, if any) to generate a plurality of subblocks of coded bits. In performing the polar coding, process 900 may involve processor 812 or processor 822 performing certain operations. For instance, process 900 may involve processor 812 or processor 822 performing encoder input bit mapping and freezing on the plurality of input subblocks. Moreover, process 900 may involve processor 812 or processor 822 additionally freezing one or more encoder input bit channels. Furthermore, process 900 may involve processor 812 or processor 822 rate-matching and subblock interleaving the plurality of input subblocks to result in one or more punctured bits that are punctured, one or more shortened bits that are shortened, and one or more output bits as the at least some of the subblocks of coded bits that are transmitted. Process 900 may proceed from 910 to 920.

At 920, process 900 may involve processor 812 transmitting, via transceiver 816, to apparatus 820 at least some of the subblocks of coded bits. Likewise, process 900 may involve processor 822 transmitting, via transceiver 826, to apparatus 810 at least some of the subblocks of coded bits.

In some implementations, in performing the polar coding, process 900 may involve processor 812 or processor 822 performing the polar coding in an IR-HARQ procedure. In such cases, in transmitting, process 900 may involve processor 812 or processor 822 performing a retransmission in the IR-HARQ procedure.

In some implementations, in additionally freezing the one or more encoder input bit channels, process 900 may involve processor 812 or processor 822 additionally freezing one of the plurality of input subblocks corresponding to one of the interleaved plurality of subblocks of coded bits containing a largest index of punctured bits compared to indexes of punctured bits contained in other ones of the interleaved plurality of subblocks of coded bits.

In some implementations, in additionally freezing the one or more encoder input bit channels, process 900 may involve processor 812 or processor 822 additionally freezing one of the plurality of input subblocks corresponding to one of the interleaved plurality of subblocks of coded bits containing a smallest index of output bits compared to indexes of output bits contained in other ones of the interleaved plurality of subblocks of coded bits.

In some implementations, in additionally freezing the one or more encoder input bit channels, process 900 may involve processor 812 or processor 822 additionally freezing one of the plurality of input subblocks corresponding to one of the interleaved plurality of subblocks of coded bits containing a least indexed bit and having a size less than a threshold.

In some implementations, in additionally freezing the one or more encoder input bit channels, process 900 may involve processor 812 or processor 822 setting information bits in one or more of the plurality of input subblocks for a retransmission to zero responsive to a number of the one or more punctured bits or a number of the one or more shortened bits for the retransmission being more than a portion of a polar mother code size used in polar coding for an initial transmission corresponding to the retransmission.

In some implementations, in additionally freezing the one or more encoder input bit channels, process 900 may involve processor 812 or processor 822 additionally freezing smallest $N/2$ bit positions of the plurality of input subblocks responsive to a number of the one or more punctured bits being larger than N/2. In such cases, N may denote a polar code size seen by a rate-matching interleaver that performs the rate-matching and subblock interleaving.

In some implementations, in additionally freezing the one or more encoder input bit channels, process 900 may involve processor 812 or processor 822 additionally freezing information bits of the plurality of input subblocks with indexes ranging from 0 to $\lceil 4/3P \rceil - 1$. In such cases, P may denote a number of punctured bits in the one or more subblocks of punctured bits.

FIG. 10 illustrates an example process 1000 in accordance with an implementation of the present disclosure. Process 1000 may represent an aspect of implementing various proposed designs, concepts, schemes, systems and methods described above, whether partially or entirely, including those described above. More specifically, process 1000 may represent an aspect of the proposed concepts and schemes pertaining to additional bit freezing for polar coding in mobile communications. Process 1000 may include one or more operations, actions, or functions as illustrated by one or more of blocks 1010 and 1020. Although illustrated as discrete blocks, various blocks of process 1000 may be divided into additional blocks, combined into fewer blocks, or eliminated, depending on the desired implementation. Moreover, the blocks/subblocks of process 1000 may be executed in the order shown in FIG. 10 or, alternatively in a different order. Furthermore, one or more of the blocks/subblocks of process 1000 may be executed iteratively. Process 1000 may be implemented by or in apparatus 810 and apparatus 820 as well as any variations thereof. Solely for illustrative purposes and without limiting the scope, process 1000 is described below in the context of apparatus 810 as a UE (e.g., UE 110) and apparatus 820 as a communication entity such as a network node or base station (e.g., network node 125) of a wireless network (e.g., wireless network 120). Process 1000 may begin at block 1010.

At 1010, process 1000 may involve processor 812 of apparatus 810, implemented in or as UE 110, performing polar coding to encode a plurality of input subblocks of information bits and frozen bits (and CRC bits, if any) to generate a plurality of subblocks of coded bits. Similarly, process 1000 may involve processor 822 of apparatus 820, implemented in or as network node 125, performing polar coding to encode a plurality of input subblocks of information bits and frozen bits (and CRC bits, if any) to generate a plurality of subblocks of coded bits. In performing the polar coding, process 1000 may involve processor 812 or processor 822 additionally freezing one of the plurality of input subblocks corresponding to one of the interleaved plurality of subblocks of coded bits which decreases polarization gain due to puncturing. Process 1000 may proceed from 1010 to 1020.

At 1020, process 1000 may involve processor 812 transmitting, via transceiver 816, to apparatus 820 at least some of the subblocks of coded bits. Likewise, process 1000 may involve processor 822 transmitting, via transceiver 826, to apparatus 810 at least some of the subblocks of coded bits.

In some implementations, in additionally freezing one of the plurality of input subblocks, process 1000 may involve processor 812 or processor 822 additionally freezing one of the plurality of input subblocks corresponding to one of the interleaved plurality of subblocks of coded bits containing a largest index of punctured bits compared to indexes of punctured bits contained in other ones of the interleaved plurality of subblocks of coded bits.

In some implementations, in additionally freezing one of the plurality of input subblocks, process 1000 may involve processor 812 or processor 822 additionally freezing one of the plurality of input subblocks corresponding to one of the interleaved plurality of subblocks of coded bits containing a smallest index of output bits compared to indexes of output bits contained in other ones of the interleaved plurality of subblocks of coded bits.

In some implementations, in performing the polar coding, process 1000 may involve processor 812 or processor 822 performing the polar coding in an IR-HARQ procedure. In such cases, in transmitting, process 1000 may involve processor 812 or processor 822 performing a retransmission in the IR-HARQ procedure. Moreover, in performing the polar coding, process 1000 may involve processor 812 or processor 822 performing some operations. For instance, process 1000 may involve processor 812 or processor 822 performing encoder input bit mapping and freezing on the plurality of input subblocks. Furthermore, process 1000 may involve processor 812 or processor 822 rate-matching and subblock interleaving the plurality of input subblocks to result in one or more punctured bits that are punctured, one or more shortened bits that are shortened, and one or more output bits as the at least some of the subblocks of coded bits that are transmitted.

ADDITIONAL NOTES

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various implementations of the present disclosure have been described herein for purposes of illustration, and that various modifications may be made without departing from the scope and spirit of the present disclosure. Accordingly, the various implementations disclosed herein are not intended to be limiting, with the true scope and spirit being indicated by the following claims.

What is claimed is:

1. A method, comprising:
    performing, by a processor of an apparatus, polar coding to encode a plurality of input subblocks of information bits, frozen bits and optional cyclic redundancy check (CRC) bits to generate a plurality of subblocks of coded bits; and
    transmitting, by the processor, at least some of the subblocks of coded bits,
    wherein the performing of the polar coding comprises:
        performing encoder input bit mapping and freezing on the plurality of input subblocks;
        additionally freezing one or more encoder input bit channels; and
        rate-matching and subblock interleaving the plurality of input subblocks to result in one or more punctured bits, one or more shortened bits, and one or more output bits as the at least some of the subblocks of coded bits that are transmitted,
    wherein the additionally freezing of the one or more encoder input bit channels comprises additionally freezing one of the plurality of input subblocks corresponding to one of the interleaved plurality of subblocks of coded bits containing a largest index of punctured bits compared to indexes of punctured bits contained in other ones of the interleaved plurality of subblocks of coded bits.

2. The method of claim 1, wherein the performing of the polar coding comprises performing the polar coding in an incremental redundancy hybrid automatic repeat request (IR-HARQ) procedure, and wherein the transmitting comprises performing a retransmission in the IR-HARQ procedure.

3. The method of claim 1, wherein the additionally freezing of the one or more encoder input bit channels further comprises setting information bits in one or more of the plurality of input subblocks for a retransmission to zero responsive to a number of the one or more punctured bits or a number of the one or more shortened bits for the retransmission being more than a portion of a polar mother code size used in polar coding for an initial transmission corresponding to the retransmission.

4. The method of claim 1, wherein the additionally freezing of the one or more encoder input bit channels further comprises additionally freezing smallest N/2 bit positions of the plurality of input subblocks responsive to a number of the one or more punctured bits being larger than N/2, and wherein N denotes a polar code size seen by a rate-matching interleaver that performs the rate-matching and subblock interleaving.

5. The method of claim 1, wherein the additionally freezing of the one or more encoder input bit channels further comprises additionally freezing information bits of the plurality of input subblocks with indexes ranging from 0 to $\lceil 4/3P \rceil - 1$, and wherein P denotes a number of punctured bits in the one or more subblocks of punctured bits.

6. A method, comprising:
    performing, by a processor of an apparatus, polar coding to encode a plurality of input subblocks of information bits, frozen bits and optional cyclic redundancy check (CRC) bits to generate a plurality of subblocks of coded bits; and
    transmitting, by the processor, at least some of the subblocks of coded bits,
    wherein the performing of the polar coding comprises additionally freezing one of the plurality of input subblocks corresponding to one of the interleaved plurality of subblocks of coded bits which decreases polarization gain due to puncturing;
    wherein the additionally freezing of one of the plurality of input subblocks comprises additionally freezing one of the plurality of input subblocks corresponding to one of the interleaved plurality of subblocks of coded bits containing a largest index of punctured bits compared to indexes of punctured bits contained in other ones of the interleaved plurality of subblocks of coded bits.

7. The method of claim 6, wherein the performing of the polar coding comprises performing the polar coding in an incremental redundancy hybrid automatic repeat request (IR-HARQ) procedure, wherein the transmitting comprises performing a retransmission in the IR-HARQ procedure, and wherein the performing of the polar coding further comprises:

performing encoder input bit mapping and freezing on the plurality of input subblocks; and rate-matching and subblock interleaving the plurality of input subblocks to result in one or more punctured bits, one or more shortened bits, and one or more output bits as the at least some of the subblocks of coded bits that are transmitted.

8. An apparatus, comprising:

a transceiver configured to communicate wirelessly; and a processor coupled to the transceiver and configured to perform operations comprising:

performing polar coding to encode a plurality of input subblocks of information bits, frozen bits and optional cyclic redundancy check (CRC) bits to generate a plurality of subblocks of coded bits; and transmitting, via the transceiver, at least some of the subblocks of coded bits, wherein, in performing the polar coding, the processor is configured to perform operations comprising:

performing encoder input bit mapping and freezing on the plurality of input subblocks;

additionally freezing one or more encoder input bit channels; and rate-matching and subblock interleaving the plurality of input subblocks to result in one or more punctured bits, one or more shortened bits, and one or more output bits as the at least some of the subblocks of coded bits that are transmitted, wherein, in additionally freezing the one or more encoder input bit channels, the processor is configured to additionally freeze one of the plurality of input subblocks corresponding to one of the interleaved plurality of subblocks of coded bits containing a largest index of punctured bits compared to indexes of punctured bits contained in other ones of the interleaved plurality of subblocks of coded bits.

9. The apparatus of claim 8, wherein, in performing the polar coding, the processor is configured to perform the polar coding in an incremental redundancy hybrid automatic repeat request (IR-HARQ) procedure, and wherein, in transmitting, the processor is configured to perform a retransmission in the IR-HARQ procedure.

10. The apparatus of claim 8, wherein, in additionally freezing the one or more encoder input bit channels, the processor is further configured to set information bits in one or more of the plurality of input subblocks for a retransmission to zero responsive to a number of the one or more punctured bits or a number of the one or more shortened bits for the retransmission being more than a portion of a polar mother code size used in polar coding for an initial transmission corresponding to the retransmission.

11. The apparatus of claim 8, wherein, in additionally freezing the one or more encoder input bit channels, the processor is further configured to additionally freeze smallest N/2 bit positions of the plurality of input subblocks responsive to a number of the one or more punctured bits being larger than N/2, and wherein N denotes a polar code size seen by a rate-matching interleaver that performs the rate-matching and subblock interleaving.

12. The apparatus of claim 8, wherein, in additionally freezing the one or more encoder input bit channels, the processor is further configured to additionally freeze information bits of the plurality of input subblocks with indexes ranging from ⌈4/3P⌉−1, and wherein P denotes a number of punctured bits in the one or more subblocks of punctured bits.

* * * * *